(12) United States Patent
Hsu

(10) Patent No.: US 10,330,714 B2
(45) Date of Patent: Jun. 25, 2019

(54) APPARATUS FOR DETECTING QUALITY OF INDOOR POWER DISTRIBUTION LINE

(71) Applicant: Cheng-Tsuen Hsu, Taipei (TW)

(72) Inventor: Cheng-Tsuen Hsu, Taipei (TW)

(*) Notice: Subject to any disclaimer, the term of this patent is extended or adjusted under 35 U.S.C. 154(b) by 52 days.

(21) Appl. No.: 15/495,988

(22) Filed: Apr. 25, 2017

(65) Prior Publication Data
US 2018/0231598 A1    Aug. 16, 2018

(30) Foreign Application Priority Data
Feb. 14, 2017 (TW) .............................. 106104712 A

(51) Int. Cl.
*G01R 31/02* (2006.01)
*G08B 21/00* (2006.01)
*G06F 19/00* (2018.01)

(52) U.S. Cl.
CPC .................................. *G01R 31/021* (2013.01)

(58) Field of Classification Search
CPC .................................................. G01R 31/021
See application file for complete search history.

(56) References Cited

U.S. PATENT DOCUMENTS

| | | | |
|---|---|---|---|
| 8,825,272 B1* | 9/2014 | Chinnadurai | G01R 31/34 180/65.285 |
| 2003/0164695 A1* | 9/2003 | Fasshauer | H02J 13/0017 324/76.21 |
| 2003/0174453 A1* | 9/2003 | Hsu | H02H 3/08 361/78 |
| 2005/0254269 A1* | 11/2005 | Lomax, Jr. | H04M 3/30 363/21.12 |
| 2006/0072271 A1* | 4/2006 | Jones | G06K 19/07758 361/93.1 |
| 2007/0085548 A1 | 4/2007 | Shinmoto et al. | |
| 2009/0187358 A1 | 7/2009 | Deaver, Sr. | |
| 2012/0235825 A1* | 9/2012 | Myers | G01R 31/026 340/652 |
| 2015/0028885 A1 | 1/2015 | Hsu | |

FOREIGN PATENT DOCUMENTS

TW    I317568    11/2009

* cited by examiner

*Primary Examiner* — Huy Q Phan
*Assistant Examiner* — Zannatul Ferdous
(74) *Attorney, Agent, or Firm* — JCIPRNET

(57) ABSTRACT

An apparatus for detecting quality of an indoor power distribution line including a power input module, a switch circuit, a load circuit and a detecting module is provided. The power input module receives an AC power through an indoor power distribution line. The switch circuit is controlled by the detecting module to transmit the AC power to the load circuit. When the switch circuit is on, the detecting module detects a voltage and a current of the load circuit to respectively serve as a first voltage value and a first current value. When the switch circuit is off, the detecting module detects a voltage of the AC power to serve as a second voltage value. The detecting module determines the quality of the indoor power distribution line based on a measurement resistance thereof obtained according to the first voltage value, the first current value and the second voltage value.

7 Claims, 3 Drawing Sheets

APPARATUS FOR DETECTING QUALITY OF INDOOR POWER DISTRIBUTION LINE

CROSS-REFERENCE TO RELATED APPLICATION

This application claims the priority benefit of Taiwan application serial no. 106104712, filed on Feb. 14, 2017. The entirety of each of the above-mentioned patent applications is hereby incorporated by reference herein and made a part of this specification.

BACKGROUND OF THE INVENTION

1. Field of the Invention

The present invention relates to a detecting apparatus, and in particular to an apparatus for detecting quality of an indoor power distribution line.

2. Description of Related Art

Generally speaking, a service life of a building can be generally up to decades of years. As the indoor power distribution line is buried inside the building (such as a wall) for a long time, the indoor power distribution line may be aged due to factors of the building (for example, long-term dampness) or the electric power application factor, but an ordinary user cannot clearly know whether the indoor power distribution line has been aged or not from the appearance of the building. In the case of the aged indoor power distribution line, once the electric power load of the indoor power distribution is excessively high, an electric wire is very likely to discharge accidentally, resulting in fire. In addition, after the laying of the indoor power distribution line is completed, the user is unable to know whether the indoor power distribution line is properly laid or not, for example, the user cannot know whether the indoor power distribution line has problems such as bad grounding of a neutral wire or grounding of a live wire. The foregoing various situations may cause the doubt of the user of the building about the quality and the status of the indoor power distribution line, and accordingly, how to detect the quality and the status of the indoor power distribution line is an importable subject of the prior art.

SUMMARY OF THE INVENTION

Accordingly, the present invention provides an apparatus for detecting quality of an indoor power distribution line, which can be used for detecting the quality and the current status of the indoor power distribution line of a building.

The apparatus for detecting the quality of the indoor power distribution line of the present invention includes a power input module, a switch circuit, a load circuit and a detecting module. The power input module receives an AC power supplied by a city power system through an indoor power distribution line. The switch circuit is coupled between a first end of the power input module and a first end of the load circuit, used for receiving the AC power from the power input module and controlled by a switch signal so as to transmit the AC power to the load circuit. The detecting module is coupled between the power input module and a second end of the load circuit, and generates the switch signal so as to control on and off of the switch circuit. When the switch circuit is on, the detecting module detects a voltage value of the load circuit and a current value of the load circuit to respectively serve as a first voltage value and a first current value. When the switch circuit is off, the detecting module detects a voltage value of the AC power to serve as a second voltage value. The detecting module determines the quality of the indoor power distribution line based on a measurement resistance thereof which is obtained according to the first voltage value, the first current value and the second voltage value.

In an embodiment of the present invention, the foregoing detecting module includes a measuring circuit and a processing circuit. The measuring circuit is used for measuring and obtaining the first voltage value, the first current value and the second voltage value. The processing circuit is coupled to the measuring circuit so as to receive the first voltage value, the first current value and the second voltage value, and generates the switch signal so as to control the on and off of the switch circuit. The processing circuit calculates the measurement resistance of the indoor power distribution line according to the first voltage value, the first current value and the second voltage value, and determines the quality of the indoor power distribution line according to the measurement resistance.

In an embodiment of the present invention, the foregoing processing circuit compares the measurement resistance with a reference resistance. When the measurement resistance is greater than the reference resistance, the processing circuit determines that the quality of the indoor power distribution line is bad.

In an embodiment of the present invention, when the measurement resistance is less than the reference resistance, the processing circuit determines that the quality of the indoor power distribution line is good.

In an embodiment of the present invention, the foregoing power input module includes a live wire end, a neutral wire end and an earth wire end. The measuring circuit is used for measuring the voltage value of the neutral wire end and the voltage value of the earth wire end to respectively serve as a neutral wire voltage value and an earth wire voltage value. The processing circuit compares the neutral wire voltage value with the earth wire voltage value. If the neutral wire voltage value is not equal to the earth wire voltage value, the processing circuit determines that a neutral wire of the indoor power distribution line is bad grounded.

In an embodiment of the present invention, if the neutral wire voltage value is equal to the earth wire voltage value, the processing circuit determines that the neutral wire of the indoor power distribution line is well grounded.

In an embodiment of the present invention, the foregoing measuring circuit is further used for measuring the voltage value of the live wire end and the voltage value of the earth wire end to respectively serve as a live wire voltage value and the earth wire voltage value. The processing circuit compares the live wire voltage value with the earth wire voltage value. If the live wire voltage value is equal to the earth wire voltage value, the processing circuit determines that a live wire and the neutral wire of the indoor power distribution line are incorrectly allocated to each other.

In an embodiment of the present invention, the foregoing apparatus for detecting the quality of the indoor power distribution line further includes a power conversion circuit. The power conversion circuit is coupled to the power input module so as to receive the AC power, converts the AC power to a DC power, and provides the DC power to power the detecting module.

In an embodiment of the present invention, the foregoing apparatus for detecting the quality of the indoor power distribution line further includes a display device. The display device is coupled to the detecting module. The detecting module displays at least one of the first voltage value, the first current value, the second voltage value, the measurement resistance and the quality of the indoor power distribution line on the display device.

In an embodiment of the present invention, the foregoing apparatus for detecting the quality of the indoor power distribution line further includes a communication module. The communication module is coupled to the detecting module. The detecting module transmits at least one of the first voltage value, the first current value, the second voltage value, the measurement resistance and the quality of the indoor power distribution line to an external electronic apparatus through the communication module.

Based on the above, the apparatus for detecting the quality of the indoor power distribution line provided by embodiments of the present invention can detect the quality and the current status of the indoor power distribution line. Therefore, the user not only can clearly know whether the indoor power distribution line has the aged phenomenon to serve as a reference evidence for replacing the indoor power distribution line, but also can clearly know whether the indoor power distribution line is properly laid.

In order to make the aforementioned features and advantages of the present invention more comprehensible, embodiments accompanied with accompanying drawings are described in detail below.

BRIEF DESCRIPTION OF THE DRAWINGS

The accompanying drawings constitute a part of this specification. The drawings illustrate embodiments of the present invention and, together with the description, serve to explain the principles of the present invention.

DESCRIPTION OF THE EMBODIMENTS

Figure 1:
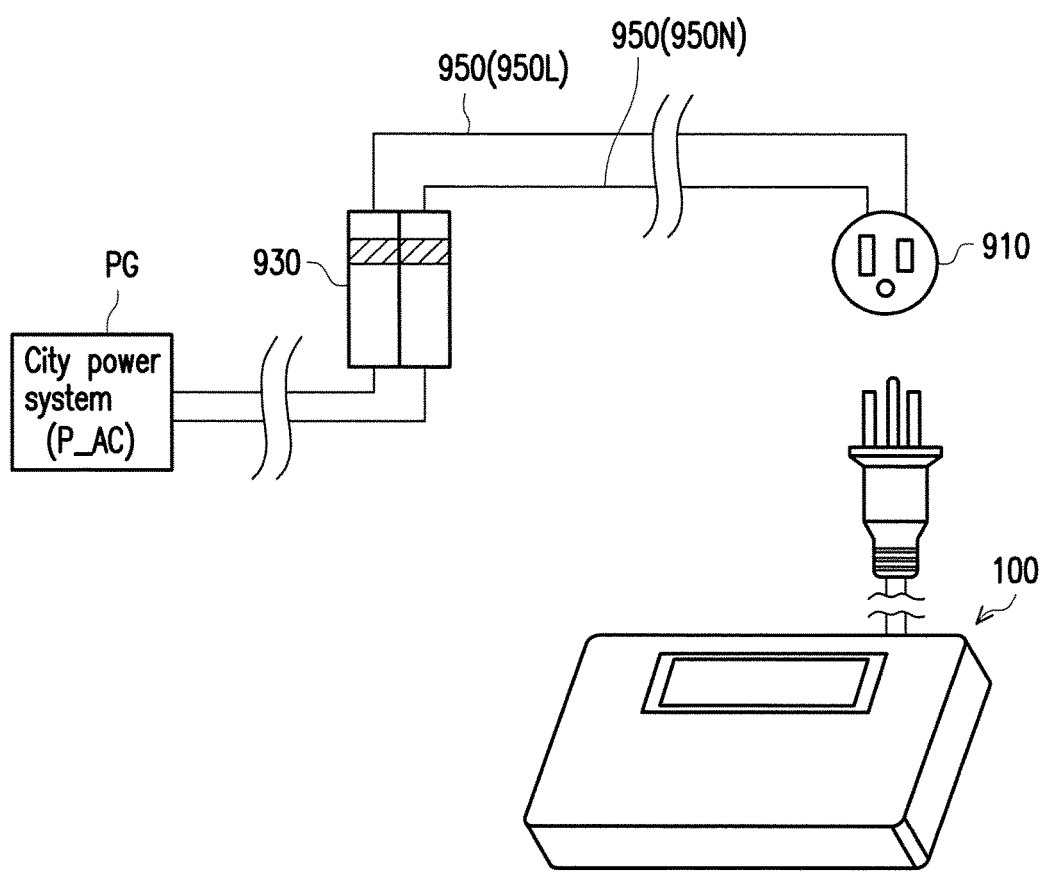
FIG. 1 is a schematic diagram illustrating an application of an apparatus for detecting quality of an indoor power distribution line according to an embodiment of the present invention.

In order to make the content of the present invention more comprehensible, embodiments are described in detail below as examples for implementing the present invention. Wherever possible, the same reference numbers are used in the drawings and the description to refer to the same or like parts.

Now refer to FIG. 1. FIG. 1 is a schematic diagram illustrating an application of an apparatus 100 for detecting quality of an indoor power distribution line according to an embodiment of the present invention. The apparatus 100 for detecting the quality of the indoor power distribution line can be plugged to a socket 910 so as to receive an AC power P_AC from a city power system PG and detects the quality and the current status of an indoor power distribution line 950 disposed between a circuit breaker 930 and the socket 910 according to the AC power, wherein the indoor power distribution line 950 can include a live wire 950L, a neutral wire 950N and an earth wire (not shown). In addition, the circuit breaker 930 serves as a power switch between the city power system PG and the indoor power distribution line 950. When the indoor power distribution line 950 is short-circuited or overloaded in power, the circuit breaker 930 can trip to interrupt a current path between the city power system PG and the indoor power distribution line 950, thereby guaranteeing the power utilization safety.

Figure 2:
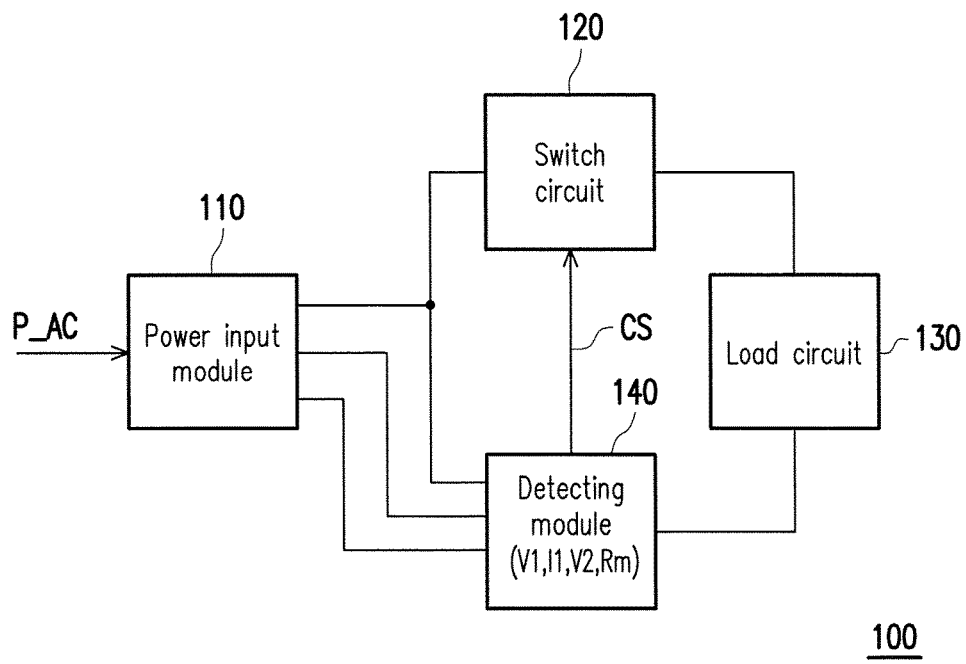
FIG. 2 is a block schematic diagram illustrating a circuit of the apparatus for detecting quality of the indoor power distribution line according to an embodiment of the present invention.

Now refer to FIG. 1 and FIG. 2 together. FIG. 2 is a block schematic diagram illustrating a circuit of the apparatus 100 for detecting the quality of the indoor power distribution line according to an embodiment of the present invention. The apparatus 100 for detecting the quality of the indoor power distribution line may include a power input module 110, a switch circuit 120, a load circuit 130 and a detecting module 140. The power input module 110 may be plugged to the socket 910 so as to receive the AC power P_AC supplied by the city power system PG. The power input module 110 can transmit the AC power P_AC to the switch circuit 120. In an embodiment of the present invention, the power input module 110 may be a plug of the apparatus 100 for detecting the quality of the indoor power distribution line, but the present invention is not limited thereto, wherein the aforementioned plug can be a plug of any specification so as to be plugged to the socket 910 of the corresponding specification.

The switch circuit 120 is coupled between a first end (i.e. the live wire end or the neutral wire end) of the power input module 110 and a first end of the load circuit 130. The switch circuit 120 can receive the AC power P_AC from the power input module 110 and is controlled by a switch signal CS to transmit the AC power P_AC to the load circuit 130. In an embodiment of the present invention, the switch circuit 120 may be various types of relays, for example, the switch circuit 120 may be an electromagnetic relay (EMR) or a solid state relay (SSR), but is not limited thereto. Furthermore, in an embodiment of the present invention, the load circuit 130 may be a resistor, but the present invention is not limited thereto.

The detecting module 140 is coupled between the power input module 110 and a second end of the load circuit 130. The detecting module 140 may generate the switch signal CS to control the on and off of the switch circuit 120.

When the switch circuit 120 is on, the city power system PG, the circuit breaker 930, the indoor power distribution line 950, the power input module 110, the switch circuit 120, the load circuit 130 and the detecting module 140 will form a closed loop where an AC current flows. In general, since the city power distribution line between the city power system PG and the circuit breaker 930 is relatively large in wire diameter and extremely low in impedance, a voltage drop produced when the aforementioned AC current flows through the city power distribution line can be neglected. The aforementioned AC current will cause the voltage drop when flowing through the indoor power distribution line 950, and will cause the voltage drop at the load circuit 130 when flowing through the apparatus 100 for detecting the quality of the indoor power distribution line. On the other hand, when the switch circuit 120 is off, there is no AC current flowing through the indoor power distribution line 950. At the moment, the AC voltage received by the power input module 110 is the AC voltage of the AC power P_AC.

Therefore, when the switch circuit 120 is on, the detecting module 140 can detect a voltage value of the load circuit 130 and a current value of the load circuit 130 to respectively serve as a first voltage value V1 and a first current value I1.

Besides, when the switch circuit 120 is off, the detecting module 140 can detect the voltage value of the AC power P_AC to serve as a second voltage value V2. The detecting module 140 can obtain the voltage value of the indoor power distribution line 950 according to the first voltage value V1 and the second voltage value V2, and can obtain a measurement resistance Rm of the indoor power distribution line 950 according to the voltage value of the indoor power distribution line 950 and the first current value I1, wherein the measurement resistance Rm is a sum of the resistance of the live wire 950L and the resistance of the neutral wire 950N, as shown in the following formula (1). Then, the detecting module 140 can determine the quality of the indoor power distribution line 950 according to the measurement resistance Rm, which will be described in detail below.

$$Rm=(V2-V1)\div I1 \qquad \text{Formula (1)}$$

Additionally, in order to reduce the influence of noise on the measurement resistance Rm and to detect relatively accurate measurement resistance, the first voltage value V1 and the first current value I1 can be respectively an average voltage value and an average current value of the load circuit 130 detected in a period of time when the switch circuit 120 is on; and the second voltage value V2 may be an average voltage value of the AC power P_AC detected in a period of time when the switch circuit 120 is off. The foregoing time period can be set according to the real application or the design requirement.

Figure 3:
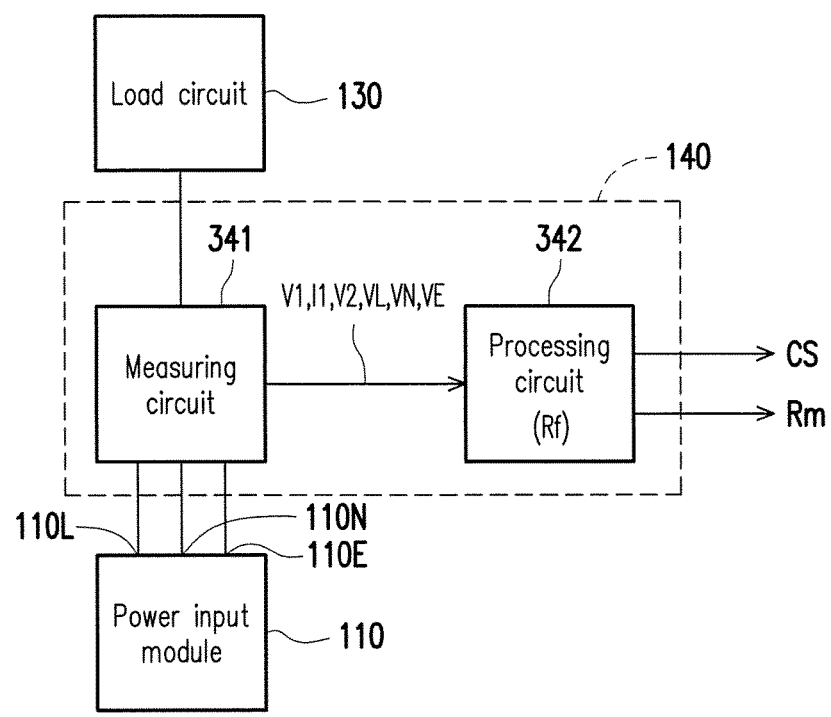
FIG. 3 is a block schematic diagram illustrating a circuit of a detecting module according to an embodiment of the present invention.

Now refer to FIG. 1 to FIG. 3 together. FIG. 3 is a block schematic diagram illustrating the circuit of the detecting module 140 according to an embodiment of the present invention. The detecting module 140 may include a measuring circuit 341 and a processing circuit 342. The measuring circuit 341 is coupled to the power input module 110 and the load circuit 130. The measuring circuit 341 is used for measuring and obtaining the first voltage value V1, the first current value I1 and the second voltage value V2. The processing circuit 342 is coupled to the measuring circuit 341 to receive the first voltage value V1, the first current value I1 and the second voltage value V2, and generates the switch signal CS to control the on and off of the switch circuit 120. The processing circuit 342 may calculate the measurement resistance Rm of the indoor power distribution line 950 according to the first voltage value V1, the first current value I1 and the second voltage value V2, and determines the quality of the indoor power distribution line 950 according to the measurement resistance Rm.

In detail, the processing circuit 342 may compare the measurement resistance Rm with a reference resistance Rf. When the measurement resistance Rm is greater than the reference resistance Rf, it indicates that the indoor power distribution line 950 is already aged or damaged, so the processing circuit 342 determines that the quality of the indoor power distribution line 950 is bad. On the contrary, when the measurement resistance Rm is less than the reference resistance Rf, it indicates that the indoor power distribution line 950 is not aged or damaged, so the processing circuit 342 may determine that the quality of the indoor power distribution line 950 is good. In an embodiment of the present invention, the reference resistance Rf can be determined according to the real application or the design requirement, for example, the reference resistance Rf can be determined according to a length, the wire diameter or materials of the indoor power distribution line 950.

In an embodiment of the present invention, the measuring circuit 341 may be implemented by adopting the existing current sensor, a voltage sensor or a power meter, but the present invention is not limited thereto.

In an embodiment of the present invention, the processing circuit 342 may be hardware, firmware, or software or machine executable program code stored in a memory and loaded and executed by a microprocessor or a digital signal processor. If the hardware is used for implementation, the processing circuit 342 may be implemented by a single integrated circuit chip, or may be implemented by multiple circuit chips, but the present invention is not limited thereto. The foregoing multiple circuit chips or the single integrated circuit chip may be implemented by using an application specific integrated circuit (ASIC) or a field programmable gate array (FPGA). The aforementioned memory may be, for example, a random access memory, a read-only memory or a flash memory.

Generally speaking, the neutral wire 950N of the indoor power distribution line 950 may be conventionally coupled with the earth wire. Accordingly, in an embodiment of the present invention, the measuring circuit 341 may be further used for measuring a voltage value of a neutral wire end 110N of the power input module 110 and a voltage value of an earth wire end 110E of the power input module 110 so as to respectively serve as a neutral wire voltage value VN and an earth wire voltage value VE. The processing circuit 342 may compare the neutral wire voltage value VN with the earth wire voltage value VE. If the neutral wire voltage value VN is not equal to the earth wire voltage value VE, the processing circuit 342 may determine that the neutral wire 950N of the indoor power distribution line 950 is bad grounded. On the contrary, if the neutral wire voltage value VN is equal to the earth wire voltage value VE, the processing circuit 342 may determine that the neutral wire 950N of the indoor power distribution line 950 is well grounded. Therefore, the apparatus 100 for detecting the quality of the indoor power distribution line can be used for detecting whether the neutral wire 950N is bad grounded or not.

In addition, when the indoor power distribution line 950 is laid, the live wire 950L may be misused as the neutral wire 950N, and the live wire 950L is coupled to the earth wire, thereby causing an electric leakage. Therefore, in an embodiment of the present invention, the measuring circuit 341 is further used for measuring the voltage value of the live wire end 110L and the voltage value of the earth wire end 110E of the power input module 110 to respectively serve as the live wire voltage value VL and the earth wire voltage value VE. The processing circuit 342 may compare the live wire voltage value VL with the earth wire voltage value VE. If the live wire voltage value VL is equal to the earth wire voltage value VE, the processing circuit 342 may determine that the live wire 950L and the neutral wire 950N of the indoor power distribution line 950 are incorrectly allocated to each other.

Figure 4:
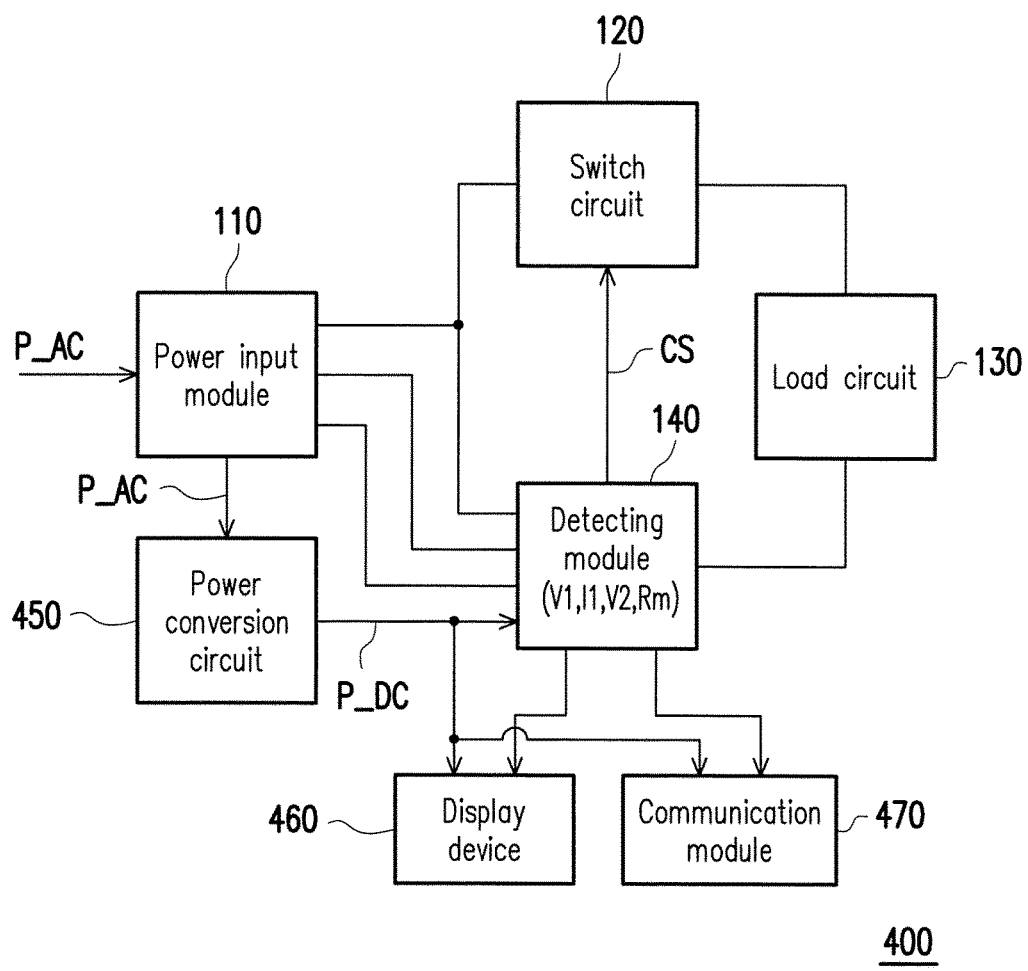
FIG. 4 is a block schematic diagram illustrating the circuit of the apparatus for detecting quality of the indoor power distribution line according to another embodiment of the present invention.

Different from the foregoing exemplary embodiment, FIG. 4 is a block schematic diagram illustrating the circuit of the apparatus 400 for detecting quality of the indoor power distribution line according to another embodiment of the present invention. Now refer to FIG. 2 and FIG. 4 together. The apparatus 400 for detecting the quality of the indoor power distribution line shown in FIG. 4 may also include a power input module 110, a switch circuit 120, a load circuit 130 and a detecting module 140. The power input module 110, the switch circuit 120, the load circuit 130 and the detecting module 140 shown in FIG. 4 are respectively similar to the power input module 110, the switch circuit 120, the load circuit 130 and the detecting module 140 shown in FIG. 2, so the descriptions thereof can refer to the foregoing descriptions and are omitted herein.

Compared with the apparatus 100 for detecting the quality of the indoor power distribution line shown in FIG. 2, the apparatus 400 for detecting the quality of the indoor power distribution line shown in FIG. 4 may further include at least one of a power conversion circuit 450, a display device 460 and a communication module 470. The power conversion circuit 450 is coupled to the power input module 110 to receive the AC power P_AC, converts the AC power P_AC to a DC power P_DC, and provides the DC power P_DC to power the detecting module 140, the display device 460 and the communication module 470. In an embodiment of the present invention, the power conversion circuit 450 may be implemented by adopting the existing AC-DC conversion circuit, and the description thereof is omitted herein.

The display device 460 is coupled to the detecting module 140. The detecting module 140 may display at least one of the first voltage value V1, the first current value I1, the second voltage value V2, the measurement resistance Rm and the quality (for example, whether aged or not) of the indoor power distribution line 950 on the display device 460. In addition, the detecting module 140 may also display the status whether the live wire 950L and the neutral wire 950N are incorrectly allocated to each other and whether the neutral wire 950N is well grounded on the display device 460. Thus, a user can clearly know the quality and the laying status of the indoor power distribution line 950 only through the information displayed by the display device 460.

Furthermore, the communication module 470 is coupled to the detecting module 140. The detecting module 140 may transmit at least one of the first voltage value V1, the first current value I1, the second voltage value V2, the measurement resistance Rm and the quality of the indoor power distribution line 950 to an external electronic apparatus (not shown) through the communication module 470 for the user to view. In addition, the detecting module 140 may also transmit the status whether the live wire 950L and the neutral wire 950N are incorrectly allocated to each other or not or whether the neutral wire 950N is bad grounded or not to the aforementioned external electronic apparatus.

In an embodiment of the present invention, the communication module 470 may be, for example, a blue-tooth module, a Wi-Fi module, a ZigBee module, a global system for mobile communication (GSM) module, a code division multiple access (CDMA) module, a wideband CDMA (WCDMA) module, a CDMA-2000 module, a time division multiple access (TDMA) module, a worldwide interoperability for microwave access (WiMAX) module, a long term evolution (LTE) module, a wireless local area network (WLAN) module or an ultra wideband (UWB) module, but the present invention is not limited thereto.

In an embodiment of the present invention, the aforementioned external mobile apparatus may be, for example, a smart phone, or a tablet personal computer, etc., but the present invention is not limited thereto. The foregoing external mobile apparatus can install a dedicated mobile application program (APP) for the apparatus 400 for detecting the quality of the indoor power distribution line. The user can click an icon of the mobile application program to enable the external mobile apparatus to execute the mobile application program, so that a screen of the external mobile apparatus displays a user interface (UI) of the mobile application program. The user interface of the mobile application program may include a status display area of the apparatus 400 for detecting the quality of the indoor power distribution line. The apparatus 400 for detecting the quality of the indoor power distribution line may transmit at least one of the first voltage value V1, the first current value I1, the second voltage value V2, the measurement resistance Rm and the quality of the indoor power distribution line 950 to the external mobile apparatus. The external mobile apparatus may may display the received information of the indoor power distribution line 950 on the aforementioned status display area. Thus, the user can clearly know the quality and the laying status of the indoor power distribution line 950 only through the information displayed by the mobile application program.

Based on the foregoing, the apparatus for detecting the quality of the indoor power distribution line provided by embodiments of the present invention can be plugged to the socket and uses the AC power supplied by the city power system as an electricity source for the detection to detect the wire quality and the current status of the indoor power distribution line. Therefore, the user not only can clearly know whether the indoor power distribution line has the aged phenomenon to serve as a reference evidence for replacing the indoor power distribution line, but also can clearly know whether the indoor power distribution line is properly laid.

The foregoing description of the present invention has been presented, but is not intended to limit the present invention. It will be apparent to those skilled in the art that various modifications and variations can be made to the present invention without departing from the spirit and scope of the present invention. Accordingly, the protection scope of the present invention is subject to the scope of the following claims.

What is claimed is:

1. An apparatus for detecting quality of an indoor power distribution line, comprising:
   a load circuit;
   a power input module, used for receiving an AC power supplied by a city power system through an indoor power distribution line;
   a switch circuit, coupled between a first end of the power input module and a first end of the load circuit, used for receiving the AC power from the power input module, and controlled by a switch signal to transmit the AC power to the load circuit; and
   a detecting module, coupled between the power input module and a second end of the load circuit, and generating the switch signal to control on and off of the switch circuit,
   wherein when the switch circuit is on, the detecting module detects a voltage value of the load circuit and a current value of the load circuit to respectively serve as a first voltage value and a first current value, and when the switch circuit is off, the detecting module detects a voltage value of the AC power to serve as a second voltage value,
   wherein the detecting module determines the quality of the indoor power distribution line based on a measurement resistance thereof which is obtained according to the first voltage value, the first current value and the second voltage value,
   wherein the detecting module comprises:
   a measuring circuit, used for measuring and obtaining the first voltage value, the first current value and the second voltage value; and
   a processing circuit, coupled to the measuring circuit so as to receive the first voltage value, the first current value and the second voltage value, and generating the switch signal so as to control the on and off of the switch circuit, wherein the processing circuit calculates the measurement resistance of the indoor power distribution line according to the first voltage value, the first current value and the second voltage value, and determines the quality of the indoor power distribution line according to the measurement resistance, wherein the power input module comprises a live wire end, a neutral wire end and an earth wire end, wherein:

the measuring circuit is further used for measuring a voltage value of the live wire end, a voltage value of the neutral wire end and a voltage value of the earth wire end to respectively serve as a live wire voltage value, a neutral wire voltage value and an earth wire voltage value; and the processing circuit compares the neutral wire voltage value with the earth wire voltage value, and if the neutral wire voltage value is not equal to the earth wire voltage value, the processing circuit determines that a neutral wire of the indoor power distribution line is bad grounded; or the processing circuit compares the live wire voltage value with the earth wire voltage value, and if the live wire voltage value is equal to the earth wire voltage value, the processing circuit determines that a live wire and a neutral wire of the indoor power distribution line are incorrectly allocated to each other.

2. The apparatus for detecting the quality of the indoor power distribution line according to claim 1, wherein the processing circuit compares the measurement resistance with a reference resistance, and when the measurement resistance is greater than the reference resistance, the processing circuit determines that the quality of the indoor power distribution line is bad.

3. The apparatus for detecting the quality of the indoor power distribution line according to claim 2, wherein when the measurement resistance is less than the reference resistance, the processing circuit determines that the quality of the indoor power distribution line is good.

4. The apparatus for detecting the quality of the indoor power distribution line according to claim 1, wherein if the neutral wire voltage value is equal to the earth wire voltage value, the processing circuit determines that the neutral wire of the indoor power distribution line is well grounded.

5. The apparatus for detecting the quality of the indoor power distribution line according to claim 1, further comprising:

a power conversion circuit, coupled to the power input module to receive the AC power, converting the AC power to a DC power, and providing the DC power to power the detecting module.

6. The apparatus for detecting the quality of the indoor power distribution line according to claim 1, further comprising:

a display device, coupled to the detecting module, wherein the detecting module displays at least one of the first voltage value, the first current value, the second voltage value, the measurement resistance and the quality of the indoor power distribution line on the display device.

7. The apparatus for detecting the quality of the indoor power distribution line according to claim 1, further comprising:

a communication module, coupled to the detecting module, wherein the detecting module transmits at least one of the first voltage value, the first current value, the second voltage value, the measurement resistance and the quality of the indoor power distribution line to an external electronic apparatus through the communication module.

* * * * *